(12) United States Patent
Bonaccio et al.

(10) Patent No.: US 8,493,250 B2
(45) Date of Patent: Jul. 23, 2013

(54) COMPARATOR OFFSET CANCELLATION IN A SUCCESSIVE APPROXIMATION ANALOG-TO-DIGITAL CONVERTER

(75) Inventors: Anthony R. Bonaccio, Shelburne, VT (US); Frank R. Keyser, III, Colchester, VT (US); Benjamin T. Voegeli, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 44 days.

(21) Appl. No.: 13/227,028

(22) Filed: Sep. 7, 2011

(65) Prior Publication Data

US 2013/0057417 A1    Mar. 7, 2013

(51) Int. Cl.
*H03M 1/06* (2006.01)
(52) U.S. Cl.
USPC ........................................ 341/118; 341/120
(58) Field of Classification Search
USPC .......... 341/118, 120, 155, 126, 133; 327/96
See application file for complete search history.

(56) References Cited

U.S. PATENT DOCUMENTS

| | | | |
|---|---|---|---|
| 5,584,059 A * | 12/1996 | Turney et al. | 455/126 |
| 6,057,891 A | 5/2000 | Guerin et al. | |
| 7,129,874 B2 | 10/2006 | Bjornsen | |
| 7,176,819 B1 | 2/2007 | Swerlein et al. | |
| 7,227,570 B2 * | 6/2007 | Sato et al. | 348/222.1 |
| 7,773,020 B2 | 8/2010 | Hurrell | |
| 2009/0261882 A1 | 10/2009 | Arsovski et al. | |
| 2010/0156684 A1 | 6/2010 | Westwick et al. | |
| 2011/0001644 A1 | 1/2011 | Messier | |

FOREIGN PATENT DOCUMENTS

| | | |
|---|---|---|
| JP | 2000-332608 | 11/2000 |
| JP | 2004-056649 | 2/2004 |

OTHER PUBLICATIONS

Jandu, "An analog to digital converter with variable threshold detection", IPCOM000007173D, Motorola TDB, Jun. 1, 1994, 5 pages.
Li et al., "Design of a low power high speed auto-zeroed column-level ADC for data readout of CMOS APS based vertex detector", 16th IEEE—NPSS Real Time Conference, 2009, pp. 295-298.
Yee, "Noise Considerations in High-Accuracy A/D Converters", IEEE Journal of Solid-State Circuits, vol. SC-21, No. 6, Dec. 1986, pp. 1011-1015.

* cited by examiner

*Primary Examiner* — Joseph Lauture
(74) *Attorney, Agent, or Firm* — David Cain; Roberts Mlotkowski Safran & Cole, P.C.

(57) ABSTRACT

A successive approximation analog-to-digital converter (ADC) includes an adjustable voltage source that applies an adjustable voltage to an input of a comparator of the ADC to cancel an offset of the ADC. The ADC also includes a control that suspends adjustments of the adjustable voltage when the adjustable voltage converges on the offset. The adjustable voltage source is a digital-to-analog converter.

21 Claims, 6 Drawing Sheets

COMPARATOR OFFSET CANCELLATION IN A SUCCESSIVE APPROXIMATION ANALOG-TO-DIGITAL CONVERTER

FIELD OF THE INVENTION

The invention relates to analog to digital converters and, more particularly, to an apparatus and a method for a mixed-signal offset cancellation loop in a successive approximation analog-to-digital converter.

BACKGROUND

Converting information in the form of analog signals to equivalent information in digital form is historic and ubiquitous in the microelectronics industry. This is because a great deal of the information produced by the physical world is analog in nature, e.g., audio signals, video signals, magnetic and electric fields, etc. As the ability to process information in digital form increases exponentially with the sophistication and scaling of digital integrated circuits, there is an ever increasing desire to convert analog signals to digital form to take advantage of these increased digital processing capabilities.

There are several approaches to the task of converting analog signals to digital form. These include various architectures or algorithms that can be implemented using analog and digital circuit designs. These architectures include flash analog-to-digital converters (ADCs), delta-sigma ADCs, pipelined ADCs, and several others. Two notable specifications of interest in an ADC are the sampling rate and the nominal resolution. The sampling rate is the rate in samples per second (s/S) at which the analog input is converted to a digital output. The nominal resolution is the number of bits in the digital output and is related to the accuracy with which the digital output represents the analog input. For example, in a one-bit ADC, the only property of the input that can be expressed in the output is whether or not it is above or below some level; in a two bit converter the input can be expressed as being in one of four regions, etc. As the number of bits of precision is increased, the accuracy with which the digital output approximates the true analog input improves but the error never goes to zero. This so-called quantization error is an inherent impairment of analog-to-digital converters.

One approach to analog-to-digital conversion is called successive approximation. In this approach, as with all ADCs, the analog input is constrained to fall within some predetermined range called the full-scale range. In a successive approximation converter, a digital-to-analog converter (DAC) whose output is constrained to nominally the same full-scale range is present. In a first processing step, the analog signal is sampled and held for subsequent conversion steps. In a second conversion step, a comparator circuit compares the sampled analog input to the DAC output when the DAC input is set to exactly one-half of its full-scale digital range. By this method, the analog input is determined to be in either the bottom half of the full-scale range (e.g., when the comparator output reads binary zero) or in the top half of the range (e.g., when the comparator reads a binary one). The result of this decision is the most significant bit (MSB) of the ADC's digital output. In a third conversion step, the DAC input is re-set to a value halfway between its half full scale value and either the zero value or the maximum value depending on the result of the comparison in the second step. By this method, the analog input is determined to be in either the bottom half or the top half of the remaining possible range of values after the result of the comparison in the first step. In subsequent conversion steps, this process is repeated until all bits in the ADC digital output are decided.

The successive approximation converter provides analog simplicity and ease of implementation in digital-centric CMOS integrated circuit fabrication processes. Such a converter requires at least 'N' steps to complete its task, where 'N' is the number of bits in the digital output. Typically at least one additional step is added to allow for sampling and/or settling at the analog input. A number 'm' of additional steps may be added for other purposes, bringing the total number of steps to N+1+m. Each step in the conversion process is typically allotted a fixed time 'T' associated with the period of a clock available on the chip/system in which the ADC operates. As a result the time required for each conversion is Tconv=(N+1+m)*T seconds where the converter sample rate is limited to 1/Tconv samples per second (s/S).

Another approach to analog-to-digital conversion is time interleaving. In this approach, a plurality of identical converter unit cells operate on an analog signal sampled at a multiple of the sample rate of each converter where the multiple is equal to the number of converter unit cells in the plurality of converter unit cells. For an analog signal sampled at time interval T seconds, e.g., having a sample rate of 1/T samples/second (s/S), two converters each operating at a sample rate of ½T s/S can be used to digitize these samples at an aggregate rate of 1/T s/S. A first analog sample is sent to the first of the two converters at time zero and a second analog sample is sent to the second converter at time T. The first converter completes its task at time 2T at which time a third analog sample is sent; the second converter completes its task at time 3T and a fourth analog sample is sent; and the process repeats. Similarly, three identical converters operating at a sample rate ⅓T can achieve the same result, and so on. Each additional cycle required by the individual converter can be accommodated at the same system sample rate by adding another converter to the plurality of converters in the time interleaved system. In this manner a plurality of N slow converters can be operated in such a way as to achieve an effective sample rate of N times the sample rate of the slow converters.

Accordingly, there exists a need in the art to overcome the deficiencies and limitations described hereinabove.

SUMMARY

In a first aspect of the invention, there is a successive approximation analog-to-digital converter (ADC) comprising an adjustable voltage source that applies an adjustable voltage to an input of a comparator of the ADC to cancel an offset of the ADC. The ADC also comprises a control that suspends adjustments of the adjustable voltage when the adjustable voltage converges on the offset. The adjustable voltage source is a digital-to-analog converter.

In another aspect of the invention, there is a method of offset cancellation in a successive approximation analog-to-digital converter (ADC). The method comprises applying a first voltage to an input of a comparator of the ADC. The method further comprises adjusting the first voltage to converge on an offset associated with the comparator. The method also comprises suspending adjustments of the first voltage based upon a net offset being within a predetermined range.

In yet another aspect of the invention, there is a method of offset cancellation in a successive approximation analog-to-digital converter (ADC). The method comprises applying a first voltage to an input of a comparator of the ADC. The method also comprises adjusting the first voltage to converge on an offset associated with the comparator. The method further comprises suspending adjustments of the first voltage based upon a net offset being within a predetermined range. The method additionally comprises determining the net offset is within the predetermined range by applying a second voltage to the input of the comparator during auxiliary cycles after bit conversion. The method also comprises reversing a polarity of the second voltage during auxiliary cycles in each of a pair of successive conversions. The method further comprises shorting input terminals of the ADC a common mode voltage during the auxiliary cycles. The net offset equals a sum of the first voltage and the offset associated with the comparator, the adjusting the first voltage comprises incrementally adjusting the first voltage, and a source of the first voltage is a digital-to-analog converter (DAC).

In another aspect of the invention, there is a successive approximation analog-to-digital converter which suspends offset corrections until net offset exceeds a set value.

In another aspect of the invention there is a hardware description language (HDL) design structure encoded on a tangible machine-readable data storage medium, the HDL design structure comprising elements that when processed in a computer-aided design system generates a machine-executable representation of a successive approximation analog-to-digital converter. The HDL design structure comprises: an adjustable voltage source that applies an adjustable voltage to an input of a comparator of the ADC to cancel an offset of the ADC, and a control that suspends adjustments of the adjustable voltage when the adjustable voltage converges on the offset.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to analog to digital converters and, more particularly, to an apparatus and a method for a mixed-signal offset cancellation loop in a successive approximation analog-to-digital converter (ADC). In accordance with aspects of the invention, an adjustable digitally controlled voltage is input to a comparator of the ADC to cancel an offset associated with the comparator. In embodiments, the digitally controlled voltage is adjusted during offset calibration by incrementally adjusting the digitally controlled voltage control word during successive conversions. Upon determining that the digitally controlled voltage has converged on the offset, further adjustments of the digitally controlled voltage are suspended.

In embodiments, after convergence the digitally controlled voltage is maintained unchanged, e.g., is not adjusted during bit conversions, until such time as it is determined that the offset of the comparator has drifted outside a certain bound. When the offset drifts beyond the certain bound (e.g., amount), the system then resumes incrementally adjusting the digitally controlled voltage during successive bit conversions, until the digitally controlled voltage once again converges on the offset, at which point further adjustments are suspended. By suspending further adjustments of the digitally controlled voltage when the digitally controlled voltage has converged on the offset, implementations of the invention suppress hunting behavior that would otherwise occur due to quantization error, e.g., the digitally controlled voltage being unable to obtain the exact value of the offset due to the quantized nature of the digital control word. In this manner, implementations of the invention prevent the undesirable situation of the digitally controlled voltage repeatedly switching between the two voltage values closest to, but not equal to, the offset value that would exactly cancel the offset.

An issue associated with analog-to-digital converters is offset. In a successive approximation type of ADC, offset can come from a number of sources but is dominated by the offset in the threshold of the single comparator. This offset results from random mismatches in the components used to construct the comparator circuit, e.g., MOS (metal oxide semiconductor) or bipolar transistors primarily but also potentially various types of integrated passive components such as resistors and capacitors. In an ideal ADC impaired by offset, the entire analog-to-digital transfer function is shifted from the nominal by an amount equal to the offset. In such a system, even though the digital output code produced by a given analog input is incorrect, it is always the same for the given analog input. Also the difference between codes produced by two different analog inputs in such a system is correct because the offset applies equally to both samples.

A time-interleaved ADC, however, is uniquely sensitive to random offsets in the plurality of ADCs. In this case, since each ADC in the plurality of ADCs operates independently on subsequent analog samples and since each ADC may have its own unique value of offset, the offsets of the plurality of ADCs contribute differently to each sample. For example, in the case where the analog sample remains constant for adjacent conversion cycles, differing offsets in the plurality of ADCs cause different digital outputs to be produced even though the analog input is the same. In an extreme case, if the analog input is held constant for many conversion cycles, the digital output would be indistinguishable from the digital output associated with a periodically changing analog input whose period is related to the number of ADCs in the plurality and whose amplitude is related to the offsets of each ADC, which is an erroneous result. In such a time-interleaved ADC, however, auxiliary cycles may be added to the conversion at the expense of adding another unit ADC cell to the plurality for each added cycle.

One of the functions that can be accomplished during the auxiliary cycle(s) is offset cancellation. Some techniques are implemented strictly in the analog domain and are generally contained within the comparator circuit itself. However, since the comparator output is a binary digital signal it can be used as input to a mixed-signal (analog and digital combined) algorithm that can use signal processing techniques to cancel the offset. Because these are predominantly digital approaches, their complexity can be higher and the cost to implement them is lower. These algorithms generally involve sampling a known quantity, e.g., usually a 'zero' level, onto the comparator during one of the auxiliary cycles, observing the digital output, and adding a quantity to the analog input such that the digital output is equally likely to be a binary one or a binary zero. In this way the offset is nulled.

Such mixed-signal approaches employ an offset digital to analog converter (DAC) to add an adjustable quantity to the analog input. In such algorithms, due to quantization error, the settled (e.g., converged) behavior is to switch the DAC between the two digital values closest to the perfect value that would exactly cancel the offset. Over time, the averaged value of the offset is zero but at any given time the offset is actually either positive or negative by at least one-half of the DAC least significant bit (LSB). Since the digital algorithm is deterministic, the switching between DAC settings occurs at a constant rate. When the frequency response of the data converter is characterized, this constant-rate offset switching (also called "hunting") behavior shows up as an undesired frequency component (referred to as a "tone" or "spur") in the ADC output.

Another issue in analog-to-digital converters is noise which results from the random nature of charge movement in electronic components and effectively adds error to the digitization. The aforementioned offset cancellation techniques also have the benefit of mitigating the effect of low-frequency noise components such as flicker noise. The noise mitigation can be improved through optimization of the frequency and sensitivity of the offset cancellation algorithm. Hence there is a trade-off between the suppression of "hunting" behavior in an offset compensation loop and the low-frequency noise cancellation in the ADC.

Implementations of the invention provide also an apparatus and a method for a mixed-signal offset cancellation loop in a successive approximation analog-to-digital converter with an adjustable "hunting" behavior. In embodiments, the apparatus includes a successive approximation analog-to-digital converter having a comparator including a means of digitally adjusting its input referred offset. The apparatus further includes a digital control for adjusting the digital control word of the comparator offset DAC. The control may be configured for sensing the average polarity of the comparator offset, driving the average polarity to a desired value, and suspending further corrections until the offset exceeds a second desired value. In particular implementations, the comparator may include a switching mechanism to sample its input so as to create a binary indication of the polarity of its input referred offset on its output (e.g., 1=positive, 0=negative). The control may include a digital-to-analog converter (DAC) for increasing or decreasing the input referred offset.

In additional embodiments, a method comprises sampling a known analog input into a successive approximation analog-to-digital converter during a first auxiliary conversion cycle. The method may also comprise calculating the polarity of the offset voltage of the successive approximation analog-to-digital converter during a second auxiliary conversion cycle and subsequently returning the ADC to normal service while subsequent offset cancellation steps occur in background digital processing. The method may additionally comprise filtering the calculated offset polarities over a plurality of conversion cycles to determine whether or not they are consistently of one polarity or another by comparing the filtered calculated offset polarities to a first threshold value. The method may further include performing one of two steps based on the determining whether the calculated offset polarities over a plurality of conversion cycles are consistently of one polarity or another. When they are consistently of one polarity, the method proceeds by adjusting the offset of the comparator in a direction determined by the consistent polarity of the calculated offset polarities and returning to the sampling step. When they are not consistently of one polarity, the method proceeds by suspending further adjustments to the offset of the comparator until the consistent polarity of the calculated offset polarities exceeds a second threshold.

In the above described method, the gain of the filter for filtering the calculated offset polarities may also be adjustable. The bandwidth of the filter for filtering the calculated offset polarities may be adjustable. The sampling, calculating, filtering, and adjusting steps may be repeated continuously without ever suspending further corrections. The first and second thresholds may be adjustable.

Figure 1:
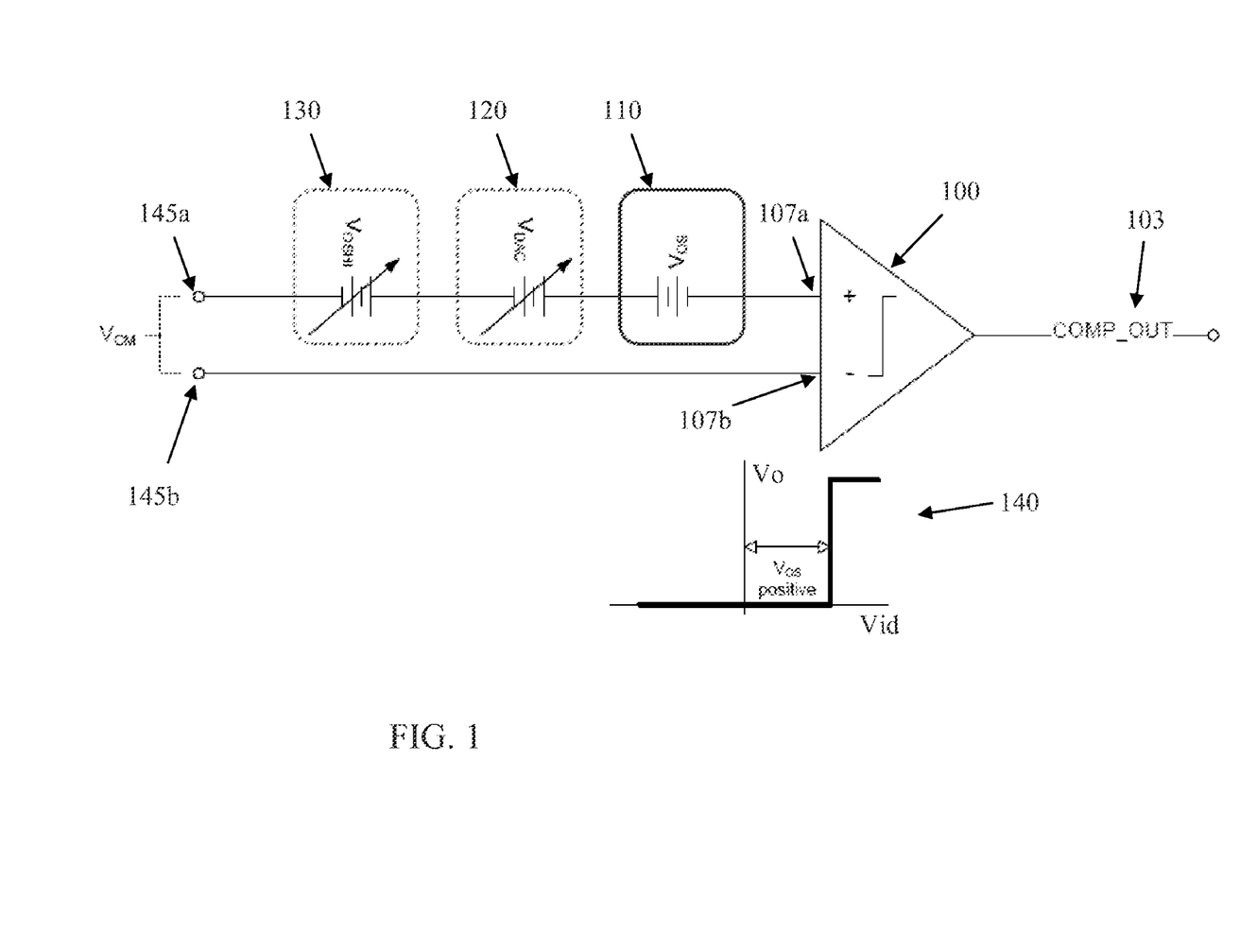
FIG. 1 shows a block diagram of an offset cancellation system and method in accordance with aspects of the invention.

FIG. 1 shows a block diagram of an offset cancellation system and method in accordance with aspects of the invention. In embodiments, comparator 100 can be provided in a successive approximation ADC. The comparator 100 has a binary digital output 103 and inputs 107a, 107b. The comparator 100 has a naturally occurring offset (VOS) 110 that, in embodiments, is modeled as a voltage in series with an input of the comparator 100. The offset VOS 110 may have a systematic, or nominal, component of any sign and magnitude and a random component which typically has a mean of zero and a statistical distribution having some variance resulting from process-induced mismatches. Regardless of the source of the offset, e.g., the internal component responsible for the introduction of the offset in the comparator circuit, the effective value of the offset may be referred back to the input of the comparator as shown in FIG. 1.

In implementations of a successive approximation register (SAR) analog to digital converter (ADC) offset cancellation algorithm in accordance with aspects of the invention, two adjustable voltages are applied to the comparator input for cancelling the offset VOS 110. The two adjustable voltages include VDAC 120 and VOSHI 130. In embodiments, the first adjustable voltage, VDAC 120, is programmable (e.g., by the offset cancellation control) between some minimum and maximum levels that are equal and opposite in sign; although the minimum and maximum levels need not be equal and opposite in sign when the systematic value of the comparator offset VOS 110 is known. In accordance with aspects of the invention, the input to first adjustable voltage VDAC 120 is a digital control word that is incrementally adjusted during offset calibration to converge on the offset VOS 110.

Since the first adjustable voltage VDAC 120 is based on a digital control word, due to quantization error, it is very rare and unlikely that the magnitude of the first adjustable voltage VDAC 120 exactly equals the magnitude of the offset VOS 110. Instead, as used herein, converged means the first adjustable voltage VDAC 120 is adjusted as close as possible to the offset VOS 110 within the resolution of a digital source of the first adjustable voltage VDAC 120, e.g., within the least significant bit (LSB) of a DAC that sets the first adjustable voltage VDAC 120 as discussed in greater detail herein.

In embodiments, the second adjustable voltage VOSHI 130 is also programmable between a desired set of levels, and is configured such that its polarity can be reversed under digital control. In accordance with aspects of the invention, the second adjustable voltage VOSHI 130 is used to create a 'deadzone' in which there are no corrections (e.g., adjustments) made to the first adjustable voltage VDAC 120. More specifically, after the first adjustable voltage VDAC 120 has been incrementally adjusted and converged on the offset VOS 110, the second adjustable voltage VOSHI 130 is used to cause particular patterns of outputs of the comparator 100 in auxiliary cycles following each bit conversion. When a certain predetermined pattern of outputs during these auxiliary cycles is produced (e.g., alternating 1's and 0's in auxiliary cycles of successive pairs of conversions), the digital control determines that the first adjustable voltage VDAC 120 is within the deadzone and suspends (e.g., does not make) adjustments to the first adjustable voltage VDAC 120. On the other hand, when a different predetermined pattern of outputs during these auxiliary cycles is produced (e.g., repeated 1's or repeated 0's in auxiliary cycles of successive pairs of conversions), the digital control determines that the offset VOS 110 has drifted such that the first adjustable voltage VDAC 120 is no longer within the deadzone, at which point the digital control resumes making adjustments to the first adjustable voltage VDAC 120 to re-converge to the offset VOS 110.

As depicted in FIG. 1, during auxiliary cycles dedicated to offset cancellation, the input terminals 145a, 145b of the ADC are connected to the analog input common mode voltage VCM. This differs notably from simply shorting the comparator inputs 107a and 107b. In an ADC in which the input signal is differential in nature and can take on values between −VFS/2 and +VFS/2, this represents the zero or mid-level analog signal at which the center code in the ADC output range should be generated. As a result of shorting the inputs of the ADC to the analog input common mode voltage, rather than simply shorting the comparator inputs, all sources of offset voltage in the ADC are addressed, such as charge injection error, etc. This is because the ADC is actually sampling a known input and being calibrated until the output is consistent with the expectation. If, instead, the comparator inputs are simply shorted for the offset cancellation, only the comparator offset contribution is cancelled, and any other offset contributions remain.

Still referring to FIG. 1, there is shown a representation of the transfer function 140 of the comparator 100. The transfer function 140 shows how the offset VOS 110 shifts the value of differential input voltage Vid at which the comparator output switches from zero to one, e.g., away from Vid=0. In this manner, any offset may be defined as the value of Vid=(V+−V−) at which the comparator output 103 switches state. In FIG. 1, when VDAC+VOSHI=VOS, then the input referred offset at the terminals 145a, 145b is zero.

The two adjustable voltages VDAC 120 and VOSHI 130 may be implemented in any suitable combination of physical elements (e.g., circuit elements) that function in the manner described herein. For example, a comparator 100 having offset voltage VOS 110 and the first adjustable voltage VDAC 120 may be efficiently implemented using an apparatus comprising a differential amplifier implemented as two source-coupled transistor pairs 307 and 317 with the bias to each pair adjusted in an analog fashion using a bias control circuit 324 to adjust the input referred offset of the aggregate pair, such as that shown in FIG. 2. In particular embodiments of the present invention, the adjustment to the bias of the two pairs 307, 317 is implemented as a DAC, e.g., replacing M5 and M6 in FIG. 2, whose inputs are digital controls from the offset cancellation algorithm described in greater detail herein with respect to FIGS. 3 and 4.

In an exemplary embodiment, differential pair 307 consists of transistors M1 and M2, and differential pair 317 consists of M3 and M4. Transistors M1 and M2 are arranged such that their gate terminals are connected to nodes INP and INN respectively, their drain terminals are connected to nodes OUTN and OUTP respectively, their source terminals are connected to node TAIL1. Similarly, transistors M3 and M4 are arranged such that their gate terminals are connected to nodes INP and INN respectively, their drain terminals are connected to nodes OUTN and OUTP respectively, and their source terminals are connected node TAIL2. In the example in FIG. 2, bias control circuit 324 consists of current balancer 350, calibration logic block 360, and switched capacitor circuit block 370.

Figure 2:
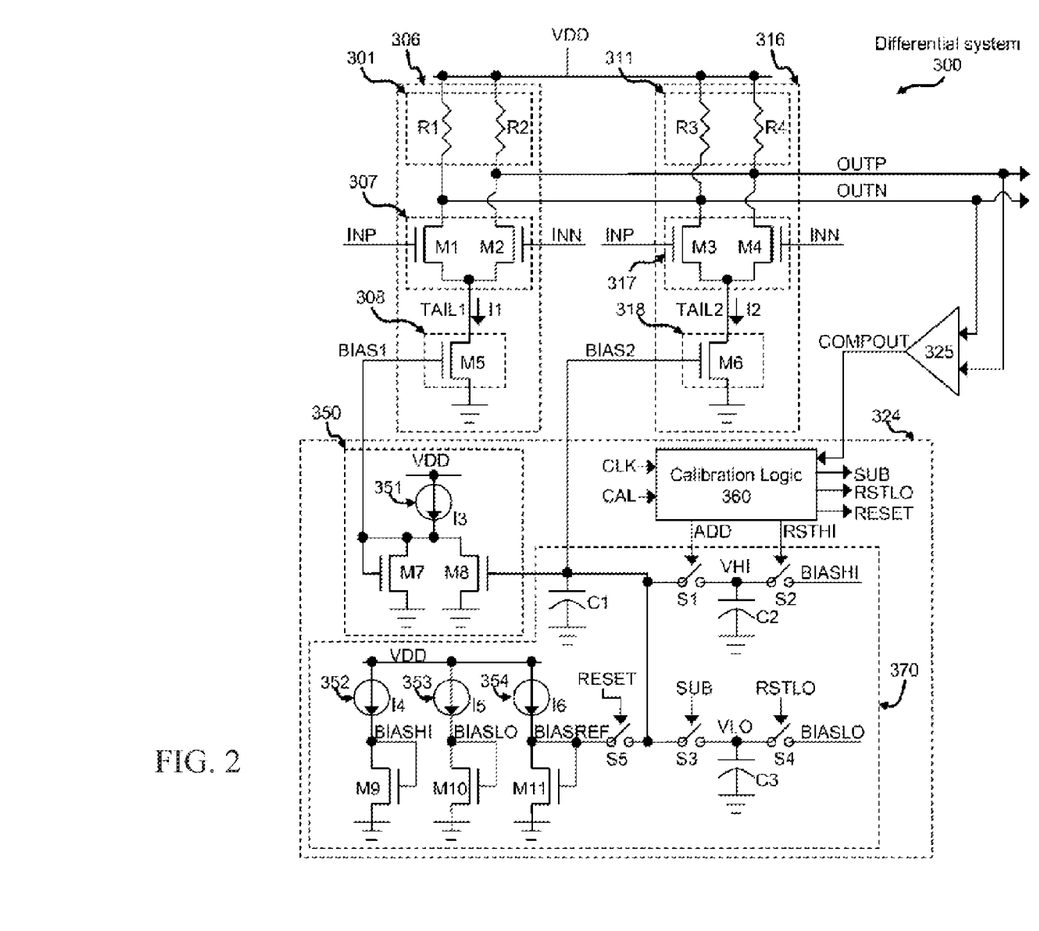
FIG. 2 shows an exemplary differential comparator system that may be used with implementations of the invention.

The current balancer 350 consists of current source 351 connected between VDD and BIAS1 which generates aggregate current I3=I1+I2, a replica current source transistor M8 which is a copy of transistor M6, and a current minor transistor M7 which is a copy of transistor M5. The drains of transistors M7 and M8 are connected to the output of current source 351 and the gates of transistor M7, thus controlling node BIAS1.

Calibration logic block 360 consists of combinatorial digital logic circuits (not shown but well known in the art) arranged to process the control signals for offset cancellation. Calibration logic block 360 has inputs COMPOUT, CLK, and CAL, and has outputs ADD, SUB, RSTHI, RSTLO, and RESET.

Switched capacitor circuit block 370 consists of switches S1, S2, S3, S4, and S5, capacitors C1, C2, and C3, transistors M9, M10, and M11, and current sources 352, 353, and 354. Switched capacitor circuit block 370 has input signals ADD, SUB, RSTHI, RSTLO, and RESET, and produces output signal BIAS2.

In accordance with aspects of the invention, the second adjustable voltage VOSHI 130 may be generated by combining programmable values of differing sign with the VDAC DAC controls. In embodiments, a switched capacitor array is provided at the input of the comparator, which array is more accurate than a current-mode or weighted-FET offset DAC. A resistor string DAC is used to generate an adjustable voltage for VOSHI and control bits OSHI and OSLO, calculated by a digital algorithm determine the sign with which the VOSHI 130 voltage is applied to the input of the comparator 100, as described in greater detail herein with respect to FIGS. 3 and 4.

Figure 3A:
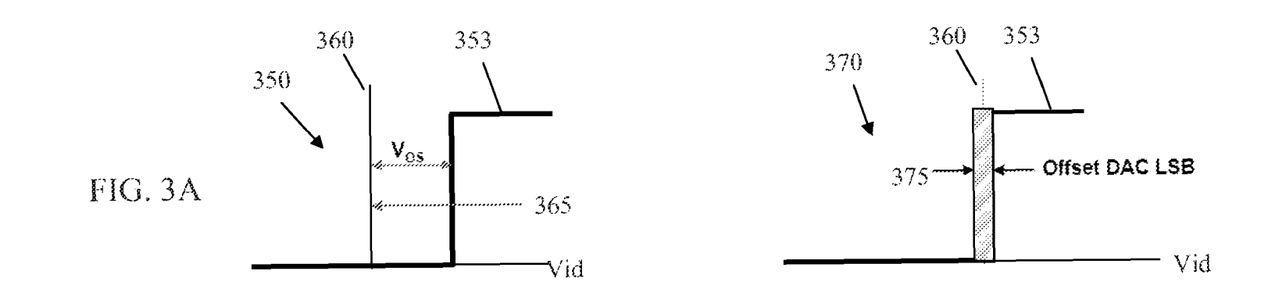
FIGS. 3A-C depict operation of an offset calibration system in accordance with aspects of the invention.
Figure 3B:
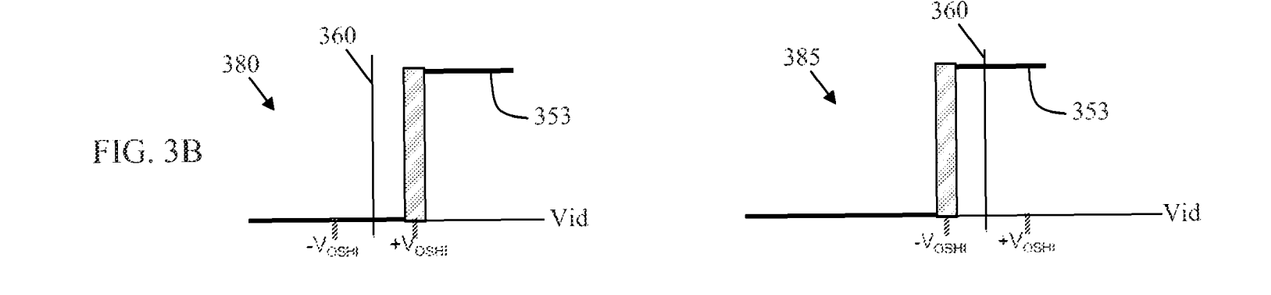
Figure 3C:
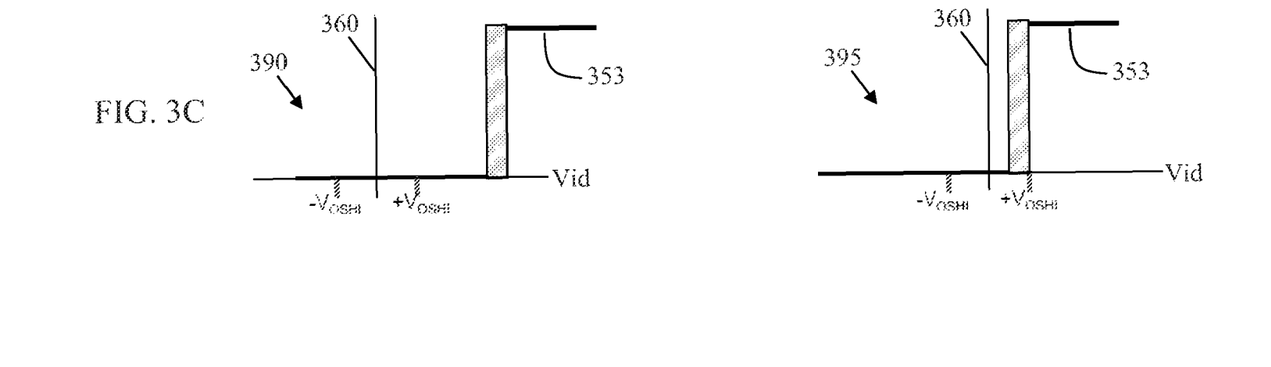

FIGS. 3A-C depict operation of the offset calibration control in accordance with aspects of the invention. In particular, FIGS. 3A-C show a transfer function 353 of a comparator (e.g., comparator 100 in FIG. 1) in various states, e.g., the output state of the comparator over a range of differential input voltages. As shown in plot 350 of FIG. 3A, the differential input voltage Vid at the inputs of the comparator (e.g., inputs 107a and 107b) is represented along the x-axis. The vertical axis 360 is located at Vid=0. In embodiments, the comparator output during offset cancellation is the value of the transfer function at a differential input of zero, because that is the condition forced by sampling the ADC's analog input common-mode level VCM onto both inputs, e.g., the difference between the inputs is zero when both inputs are the same.

As shown at plot 350 of FIG. 3A, the offset (e.g., VOS 110) prior to performing offset cancellation may be positive, in which case the comparator (e.g., comparator 100) outputs a value of zero when VCM is applied to both inputs (e.g., terminals 145a, 145b). However, the invention is not limited to a situation in which the offset is positive, and implementations of the invention may be used with a negative offset.

Implementations of the invention utilize a zero-mode offset cancellation process that incrementally adjusts the value of VDAC (e.g., VDAC 120) to drive the transfer function 353 in the direction of the arrow 365 toward the vertical axis 360, which corresponds to a net offset of zero. In embodiments, the polarity of the offset is accumulated for a time and the accumulated result is compared to a threshold, which is conventional such that further explanation is not believed necessary.

This may be performed digitally as described herein, or may be performed with an analog integrator or low-pass filter. When the threshold is exceeded, the VDAC offset DAC is incremented by one or more counts in the negative direction, the accumulator is reset, and the process repeats until VOS is driven to zero.

Plot 370 of FIG. 3A shows the transfer function after the offset calibration, e.g., when the value of VDAC 120 has converged on the value of the offset VOS 110. Convergence is represented by the vertical step of the transfer function 353 being within a range 375 around the vertical axis 360. In a DAC-based offset calibration system, the magnitude of the range 375 is defined by the LSB of the DAC. For example, the LSB of the DAC may correspond to an adjustment of 1.0 mV in the VDAC 120, in which case the magnitude of the range 375 would be 1.0 mV. In the same example, the magnitude of VOS 110 may be 3.5 mV. In this situation, due to quantization error, the offset calibration would adjust VDAC 120 to one of its two closest possible values to 3.5 mV, e.g., to either 3.0 mV or 4.0 mV. Thus, VDAC 120 does not exactly equal VOS 110, such that Vid does not equal zero.

Upon converging as described above, the offset cancellation control may oscillate VDAC 120 between the two digital values that are closest to VOS 110, e.g., alternately forcing a Vid of +½ LSB (+0.5 mV in this example) and then −½ LSB (−0.5 mV in this example). In such a situation, for a constant (e.g., unchanging) analog input to the ADC, the oscillation of VDAC 120 may produce a frequency component in the ADC output.

Accordingly, implementations of the invention utilize a control (e.g., a digital control) that detects a condition corresponding to an oscillating state of VDAC 120 and changes to a mode in which adjustments to VDAC 120 are suspended. In embodiments, upon convergence of VDAC to VOS, the control adds +VOSHI to the net offset (e.g., VOS+VDAC) during a first cycle (e.g., a first auxiliary cycle) after the last cycle of a bit conversion, and adds −VOSHI (e.g., opposite polarity) to the net offset during a first cycle (e.g., a first auxiliary cycle) after the immediately succeeding bit conversion. This is depicted in plots 380 and 385 of FIG. 3B, which represent the effective comparator transfer function during auxiliary cycles that occur after the last cycle of a successive pair of bit conversions. For example, if the ADC utilizes a four bit conversion, then the plots 380 and 385 depict the effective comparator transfer function in the fifth (auxiliary) cycle that occurs after the fourth cycle of each of a successive pair of bit conversions.

When the net offset (e.g., VOS+VDAC) is less than VOSHI, adding +VOSHI to VDAC+VOS forces the transfer function to the right of vertical axis 360, as shown in plot 380. Also when the net offset is less than VOSHI, adding −VOSHI to VDAC+VOS forces the transfer function to the left of vertical axis 360, as shown in plot 385. In this manner, when the net offset (e.g., the sum of VDAC and VOS) is less than VOSHI, alternating the polarity of VOSHI added to VDAC+VOS in the auxiliary cycle of successive conversions causes the output of the comparator to alternate between 0 and 1 between conversions in each successive pair of conversions. This alternating output of the comparator during the auxiliary cycles is used by the control to define the deadzone in which adjustments of VDAC are suspended. The comparator output may still be integrated in the offset cancellation process, but its oscillatory behavior results in no net update to the integrator or hence the VDAC voltage. In this way, the oscillatory behavior at the output of the VDAC during bit conversions is defeated.

FIG. 3C shows the effective comparator transfer function during auxiliary cycles of a pair of successive conversions when VOS 110 has drifted from its initial value. The magnitude of an offset voltage of a comparator, e.g., VOS 110, may drift during use due to any number of conditions, such as temperature, supply voltage, aging, etc. When VOS 110 drifts by a sufficient amount, e.g., such that VDAC+VOS is greater than VOSHI, the comparator produces the same output (either successive zeros or successive ones) in the auxiliary cycles of a pair of successive conversions. For example, plot 390 shows the transfer function during the auxiliary cycle of a first of a pair of successive conversions, during which +VOSHI is added to VOS+VDAC, and plot 395 shows the transfer function at the auxiliary cycle of a second of the pair of successive conversions during which −VOSHI is added to VOS+VDAC. In both plots 390 and 395, the transfer function is driven to the right of the vertical axis 360, indicating that the comparator outputs zeros in the auxiliary cycles of each of a pair of successive conversions.

In embodiments, when the control detects the drift depicted in FIG. 3C, e.g., by detecting consistent comparator outputs (e.g., repeated ones or repeated zeros) during a number of successive conversions, the control sets the magnitude of VOSHI to zero and resumes adjusting VDAC 120 in the manner described with respect to FIG. 3A. In this manner, when the offset VOS 110 drifts out of the deadzone, the control resumes offset cancellations by resuming adjustments to VDAC 120 to re-converge VDAC 120 onto the now-drifted VOS 110. When the offset cancellation causes VDAC 120 to re-converge on VOS 110, the control then suspends adjustments of VDAC 120 again, and begins adding VOSHI in successive auxiliary cycles to monitor VDAC+VOS as described above with respect to FIGS. 3B and 3C.

Figure 4:
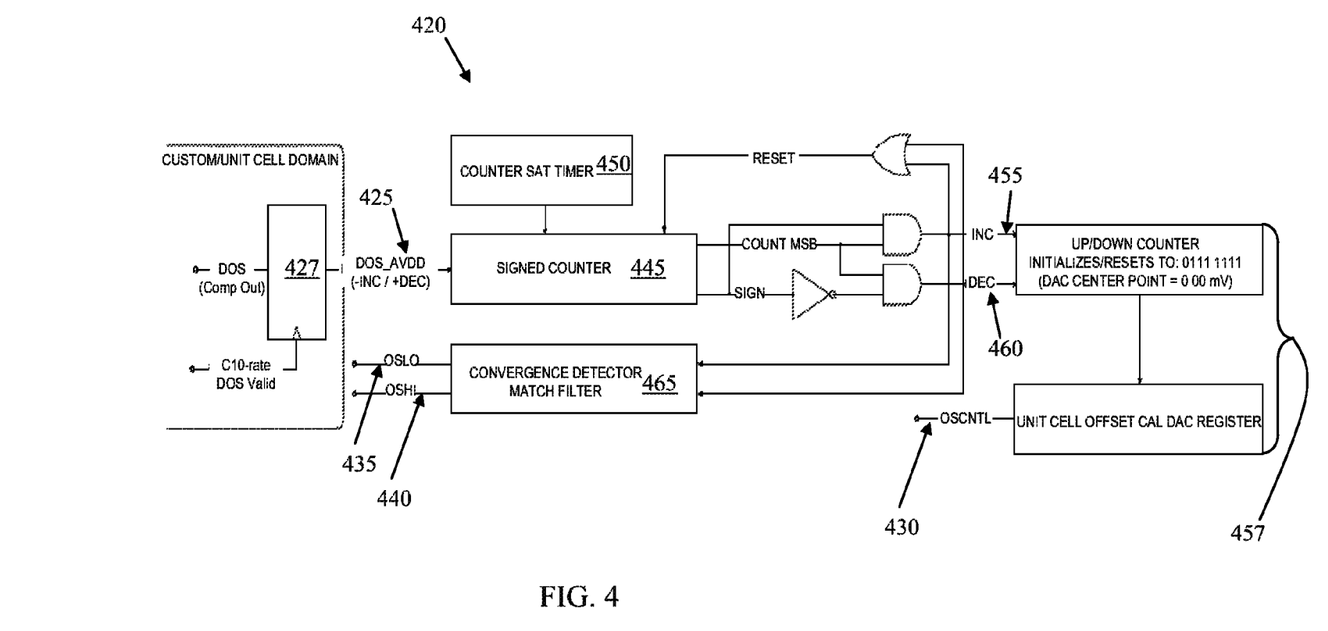
FIG. 4 shows a block diagram of a digital control in accordance with aspects of the invention.

In embodiments, the control described herein may be implemented as a digital control, e.g., in Verilog RTL and synthesized to library standard cell gates and latches. As shown in FIG. 4, in embodiments, a digital control 420 takes as input the offset polarity bit 425 generated during the auxiliary cycle in a given conversion from a latch 427 associated with the output of the comparator, and generates the DAC control bits 430 for VDAC 120 as well as the OSHI and OSLO polarity control bits 435 and 440 for VOSHI 130. The offset polarity is filtered by a signed counter 445 having a programmable saturation value. The time (e.g., in digital clock cycles) that the signed counter 445 is allowed to remain saturated is measured by a programmable counter saturation timer 450. When this time exceeds the programmed threshold (e.g., saturation value), the VDAC controls 457 are incremented at reference numeral 455 or decremented at reference numeral 460 depending on the saturated state (e.g., consecutive zeros or consecutive ones) the counter 445.

The counter 445 is reset when the DAC is incremented or decremented and the process repeats until the oscillatory (converged) behavior is observed by a match filter block 465 on the increment and decrement controls to the DAC. When this happens, the digital control 420 begins to assert OSLO 435 and OSHI 440 alternately, the counter 445 is re-set, and no corrections are issued (e.g., adjustments are made) to VDAC until and if the net offset of VOS+VDAC exceeds the analog programmed value of VOSHI. In this manner, the offset cancellation method and apparatus has adjustable gain, bandwidth, and deadzone.

Figure 5:
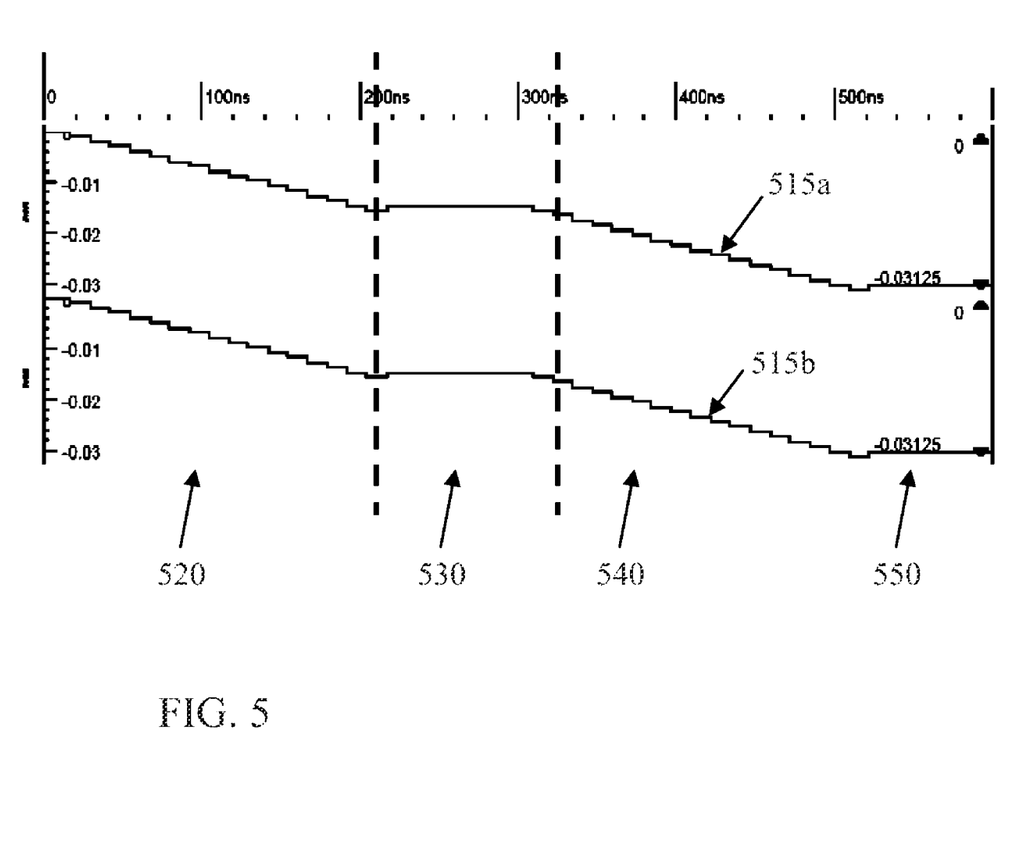
FIG. 5 shows simulation data in accordance with aspects of the invention.

FIG. 5 shows simulation data in accordance with aspects of the invention. Lines 515a and 515b represent magnitude of VDAC 120 voltages for two identical ADCs provided with mixed-signal offset cancellation loop as described herein.

The vertical axis represents voltage, and the horizontal axis represents simulation time. During time 520, the VDAC is undergoing offset cancellation to converge on VOS, e.g., the value of VDAC is being incrementally adjusted by the controller to converge on VOS. During time 530, convergence has been reached and adjustments of VDAC are suspended, e.g., VDAC remains substantially unchanged. A drift of VOS is artificially introduced at the end of time 530, which causes the control to resume adjustments of VDAC during time 540. Then at time 550, VDAC has converged on VOS again, and adjustments to VDAC are once again suspended.

Advantageously, the present invention provides for the elimination of "hunting" behavior if net offset remains within programmed bounds, e.g., with the deadzone. Implementation of aspects of the invention, such as the control, may be primarily in the digital domain allowing for complex filtering and thresholding with minimum power, area, variability, and design time. Embodiments also advantageously provide for re-setting the ADC input to a known state at a specific point in the conversion cycle so as to minimize the effects of past history on future conversions.

Figure 6:
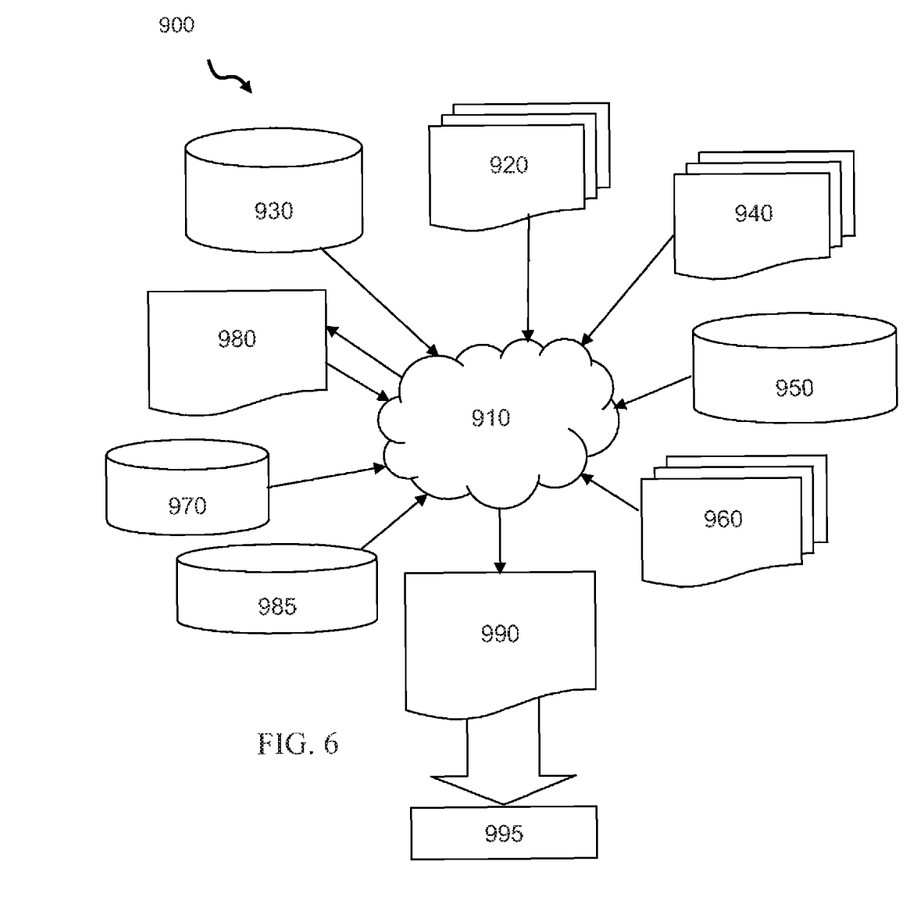
FIG. 6 is a flow diagram of a design process used in semiconductor design, manufacture, and/or test.

FIG. 6 is a flow diagram of a design process used in semiconductor design, manufacture, and/or test. FIG. 6 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1, 2, and 4. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 6 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1, 2, and 4. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1, 2, and 4 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1, 2, and 4. In one embodiment, design structure 990 may comprise a compiled, executable HDL simulation model that functionally simulates the devices shown in FIGS. 1, 2, and 4.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1, 2, and 4. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Many modifications and variations will be apparent to those of ordinary skill in the art without departing from the scope and spirit of the invention. The corresponding structures, materials, acts, and equivalents of all means or step plus function elements in the claims, if applicable, are intended to include any structure, material, or act for performing the function in combination with other claimed elements as specifically claimed. Accordingly, while the invention has been described in terms of embodiments, those of skill in the art will recognize that the invention can be practiced with modifications and in the spirit and scope of the appended claims.

What is claimed is:

1. A successive approximation analog-to-digital converter (ADC), comprising:
   an adjustable voltage source that applies an adjustable voltage to an input of a comparator of the ADC to cancel an offset of the ADC; and
   a control that suspends adjustments of the adjustable voltage when the adjustable voltage converges on the offset, wherein the adjustable voltage source is a digital-to-analog converter (DAC).

2. The analog-to-digital converter of claim 1, wherein the control incrementally adjusts a value of the adjustable voltage to converge the adjustable voltage on a value of the offset.

3. The analog-to-digital converter of claim 1, wherein the control comprises a digital control.

4. The analog-to-digital converter of claim 1, wherein the control continues suspending adjustments of the adjustable voltage while a net offset remains within a predetermined range.

5. The analog-to-digital converter of claim 4, wherein the net offset equals a sum of the adjustable voltage and the offset.

6. The analog-to-digital converter of claim 4, wherein the control determines the net offset is one of inside and outside the predetermined range by adding a second adjustable voltage value equal to the predetermined range to an input of the comparator during auxiliary cycles after a bit conversion.

7. The analog-to-digital converter of claim 6, wherein the control changes a polarity of the second adjustable voltage during each successive conversion.

8. The analog-to-digital converter of claim 6, wherein input terminals of the ADC are connected to a common mode voltage during the auxiliary cycles.

9. The analog-to-digital converter of claim 4, wherein the control resumes adjusting the adjustable voltage based upon the net offset drifting outside the predetermined range.

10. A method of offset cancellation in a successive approximation analog-to-digital converter (ADC), comprising:
    applying a first voltage to an input of a comparator of the ADC;
    adjusting the first voltage to converge on an offset associated with the comparator; and
    suspending adjustments of the first voltage based upon a net offset being within a predetermined range.

11. The method of claim 10, wherein the net offset equals a sum of the first voltage and the offset associated with the comparator.

12. The method of claim 10, wherein the adjusting the first voltage comprises incrementally adjusting the first voltage.

13. The method of claim 10, wherein a source of the first voltage is a digital-to-analog converter (DAC).

14. The method of claim 10, further comprising:
    determining the net offset has drifted outside the predetermined range; and
    resuming the adjusting the first voltage to re-converge on the offset associated with the comparator.

15. The method of claim 10, further comprising determining the net offset is within the predetermined range by applying a second voltage to the input of the comparator during auxiliary cycles after bit conversion.

16. The method of claim 15, further comprising changing a polarity of the second voltage during auxiliary cycles in each successive one of a pair of successive conversions.

17. The method of claim 15, further comprising shorting input terminals of the ADC to a common mode voltage during the auxiliary cycles.

18. The method of claim 15, wherein a magnitude of the second voltage is programmable.

19. A method of offset cancellation in a successive approximation analog-to-digital converter (ADC), comprising:
applying a first voltage to an input of a comparator of the ADC;
adjusting the first voltage to converge on an offset associated with the comparator;
suspending adjustments of the first voltage based upon a net offset being within a predetermined range;
determining the net offset is within the predetermined range by applying a second voltage to the input of the comparator during auxiliary cycles after bit conversion;
reversing a polarity of the second voltage during auxiliary cycles in each of a pair of successive conversions; and
shorting input terminals of the ADC to a common mode voltage during the auxiliary cycles,
wherein the net offset equals a sum of the first voltage and the offset associated with the comparator;
the adjusting the first voltage comprises incrementally adjusting the first voltage;
a source of the first voltage is a digital-to-analog converter (DAC).

20. A successive approximation analog-to-digital converter which suspends offset corrections until net offset exceeds a set value, wherein the net offset equals a sum of an adjustable voltage applied to an input of a comparator and an initial offset of the comparator.

21. The successive approximation analog-to-digital converter of claim 20, wherein the set value is defined by an output of a digital to analog converter that is applied to the input of the comparator during auxiliary cycles after bit conversion.

* * * * *